US010734991B1

(12) United States Patent
Hsu et al.

(10) Patent No.: US 10,734,991 B1
(45) Date of Patent: Aug. 4, 2020

(54) VOLTAGE SWITCHING DEVICE, INTEGRATED CIRCUIT DEVICE AND VOLTAGE SWITCHING METHOD

(71) Applicant: NANYA TECHNOLOGY CORPORATION, New Taipei (TW)

(72) Inventors: Ting-Shuo Hsu, New Taipei (TW); Chih-Wei Shen, Yunlin County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/460,218

(22) Filed: Jul. 2, 2019

(51) Int. Cl.
| | |
|---|---|
| *H03K 17/16* | (2006.01) |
| *H03K 17/06* | (2006.01) |
| *H03K 17/10* | (2006.01) |
| *H01L 27/092* | (2006.01) |
| *H03K 19/094* | (2006.01) |
| *G05F 1/618* | (2006.01) |
| *H03K 19/0185* | (2006.01) |
| *G01R 31/74* | (2020.01) |

(52) U.S. Cl.
CPC ........... *H03K 17/162* (2013.01); *G01R 31/74* (2020.01); *G05F 1/618* (2013.01); *H01L 27/092* (2013.01); *H03K 17/063* (2013.01); *H03K 17/102* (2013.01); *H03K 19/0185* (2013.01); *H03K 19/094* (2013.01)

(58) Field of Classification Search
CPC ....... G11C 17/16; G11C 17/165; G11C 17/18; H03K 17/162; H03K 17/063; H03K 17/102; H03K 19/094

USPC .................................................. 327/427, 525
See application file for complete search history.

(56) References Cited

FOREIGN PATENT DOCUMENTS

| | | | | |
|---|---|---|---|---|
| KR | 10-2009-072815 | * | 7/2009 | ......... G11C 11/4074 |
| TW | 201101311 A | | 1/2011 | |
| TW | 201123194 A | | 7/2011 | |
| TW | 201440064 A | | 10/2014 | |
| TW | 201519235 A | | 5/2015 | |
| TW | 201903758 A | | 1/2019 | |

OTHER PUBLICATIONS

Office Action dated Jan. 31, 2020 related to Taiwanese Application No. 108127195.

* cited by examiner

*Primary Examiner* — John W Poos
(74) *Attorney, Agent, or Firm* — Muncy, Geissler, Olds & Lowe, P.C.

(57) ABSTRACT

A voltage switching device, an integrated circuit device, and a voltage switching method are provided. The voltage switching device includes a reference voltage generator generating a first reference voltage and a second reference voltage, a fuse system coupled to a circuit device, and a switch circuit coupled to the reference voltage generator, the fuse system, and the circuit device. The fuse system generates a first enable signal and a second enable signal according to an input signal from a circuit device. The switch circuit transmits the first reference voltage or the second reference voltage to the circuit device according to the first enable signal and the second enable signal from the fuse system.

16 Claims, 5 Drawing Sheets

VOLTAGE SWITCHING DEVICE, INTEGRATED CIRCUIT DEVICE AND VOLTAGE SWITCHING METHOD

TECHNICAL FIELD

The present disclosure relates to a voltage switching device, an integrated circuit device, and a voltage switching method, and more particularly, to a voltage switching device, an integrated circuit device, and a voltage switching method employing a fuse system.

DISCUSSION OF THE BACKGROUND

Fuse elements are a widely used feature in integrated circuits for a variety of purposes, such as improving manufacturing yield or customizing a generic integrated circuit. For example, by replacing defective circuits on a chip with duplicate or redundant circuits on the same chip, manufacturing yields can be significantly increased. A fuse disconnected by a laser beam is referred to as a laser fuse, while a fuse disconnected by passing an electrical current, or blowing, is referred to as an electrical fuse, or e-fuse. By selectively blowing fuses within an integrated circuit, a circuit design may be economically manufactured and adapted to a variety of custom uses. However, fuse systems used to control a system function or to improve manufacturing yield are irreversible, and therefore a reversible voltage switching device employing a fuse system is highly desirable.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a voltage switching device, including a reference voltage generator generating a first reference voltage and a second reference voltage, a fuse system coupled to a circuit device, and a switch circuit coupled to the reference voltage generator, the fuse system, and the circuit device. The fuse system generates a first enable signal and a second enable signal according to an input signal from a circuit device. The switch circuit transmits the first reference voltage or the second reference voltage to the circuit device according to the first enable signal and the second enable signal from the fuse system.

In some embodiments, the reference voltage generator includes a plurality of resistors coupled in series between a power supply terminal and a ground terminal, the first reference voltage is generated at a first output terminal between a first resistor and a second resistor, and the second reference voltage is generated at a second output terminal between the second resistor and a third resistor.

In some embodiments, the fuse system includes a controller generating a first fuse signal and a second fuse signal according to the input signal, a first fuse element coupled between a first inverter and the controller, a NAND gate coupled between the first inverter and a second inverter, and a second fuse element coupled between the controller and the NAND gate. The first fuse element is configured according to the first fuse signal, wherein when the first fuse element is blown according to the first fuse signal, the first fuse signal is at a logic high level. The second fuse element is configured according to the second fuse signal, wherein when the second fuse element is blown according to the second fuse signal, the second fuse signal is at the logic high level.

In some embodiments, the NAND gate is coupled between a third output terminal and the second fuse element, and the second inverter is coupled between a fourth output terminal and the NAND gate.

In some embodiments, the first enable signal is generated at the third output terminal, and the second enable signal is generated at the fourth output terminal.

In some embodiments, the switch circuit includes a first circuit and a second circuit. The first circuit includes a first PMOS transistor and a first NMOS transistor, and the second circuit includes a second PMOS transistor and second NMOS transistor.

In some embodiments, the first enable signal is applied to the gates of the first NMOS transistor and the second PMOS transistor. The second enable signal is applied to the gates of the first PMOS transistor and the second NMOS transistor. The first circuit outputs the first reference voltage when the first PMOS transistor and the first NMOS transistor are turned on according to the first enable signal and the second enable signal. The second circuit outputs the second reference voltage when the second PMOS transistor and the second NMOS transistor are turned on according to the first enable signal and the second enable signal.

Another aspect of the present disclosure provides an integrated circuit device including a voltage switching device. The voltage switching device includes a fuse system coupled to a circuit device, and a switch circuit coupled to the fuse system and the circuit device. The fuse system generates a first enable signal and a second enable signal according to an input signal from a circuit device. The switch circuit transmits the first reference voltage or the second reference voltage to the circuit device according to the first enable signal and the second enable signal from the fuse system.

In some embodiments, the voltage switching device further includes a reference voltage generator generating the first reference voltage and the second reference voltage.

In some embodiments, the reference voltage generator includes a plurality of resistors coupled in series between a power supply terminal and a ground terminal. The first reference voltage is generated at a first output terminal between a first resistor and a second resistor, and the second reference voltage is generated at a second output terminal between the second resistor and a third resistor.

In some embodiments, the fuse system includes a controller generating a first fuse signal and a second fuse signal according to the input signal, a first fuse coupled between a first inverter and the controller, a NAND gate coupled between the first inverter and a second inverter, and a second fuse element coupled between the controller and the NAND gate. The first fuse element is configured according to the first fuse signal, wherein when the first fuse element is blown according to the first fuse signal, the first fuse signal is at a logic high level. The second fuse element is configured according to the second fuse signal, wherein when the second fuse element is blown according to the second fuse signal, the second fuse signal is at the logic high level.

In some embodiments, the NAND gate is coupled between a third output terminal and the second fuse element, and the second inverter is coupled between a fourth output terminal and the NAND gate.

In some embodiments, the first enable signal is generated at the third output terminal, and the second enable signal is generated at the fourth output terminal.

In some embodiments, the switch circuit includes a first circuit and a second circuit. The first circuit includes a first PMOS transistor and a first NMOS transistor, and the second circuit includes a second PMOS transistor and second NMOS transistor.

In some embodiments, the first enable signal is applied to the gates of the first NMOS transistor and the second PMOS transistor. The second enable signal is applied to the gates of the first PMOS transistor and the second NMOS transistor. The first circuit outputs the first reference voltage when the first PMOS transistor and the first NMOS transistor are turned on according to the first enable signal and the second enable signal. The second circuit outputs the second reference voltage when the second PMOS transistor and the second NMOS transistor are turned on according to the first enable signal and the second enable signal.

In some embodiments, an external reference voltage generator generates the first reference voltage and the second reference voltage. The external reference voltage generator includes a plurality of resistors coupled in series between a power supply terminal and a ground terminal. The first reference voltage is generated at a first output terminal between a first resistor and a second resistor, and the second reference voltage is generated at a second output terminal between the second resistor and a third resistor.

Another aspect of the present disclosure provides a voltage switching method, including generating a first reference voltage and a second reference voltage with a reference voltage generator; generating, with a fuse system, a first enable signal and a second enable signal according to an input signal from a circuit device; and transmitting, with a switch circuit, the first reference voltage or the second reference voltage to the circuit device according to the first enable signal and the second enable signal, in which the switch circuit is coupled to the reference voltage generator, the fuse system, and the circuit device.

In some embodiments, the voltage switching method further includes generating, with a controller of the fuse system, a first fuse signal and a second fuse signal according to the input signal; configuring a first fuse element of the fuse system according to the first fuse signal, in which the first fuse element is coupled between a first inverter and the controller, and when the first fuse element is blown according to the first fuse signal, the first fuse signal is at a logic high level; and configuring a second fuse element of the fuse system according to the second fuse signal, in which the second fuse element is coupled between the controller and a NAND gate, and when the second fuse element is blown according to the second fuse signal, the second fuse signal is at the logic high level.

In some embodiments, the voltage switching method further includes providing a first PMOS transistor and a first NMOS transistor in a first circuit of the switch circuit; and providing a second PMOS transistor and a second NMOS transistor in a second circuit of the switch circuit.

In some embodiments, the voltage switching method further includes applying the first enable signal to the gates of the first NMOS transistor and the second PMOS transistor; applying the second enable signal to the gates of the first PMOS transistor and the second NMOS transistor; outputting the first reference voltage with the first circuit when the first PMOS transistor and the first NMOS transistor are turned on according to the first enable signal and the second enable signal; and outputting the second reference voltage with the second circuit when the second PMOS transistor and the second NMOS transistor are turned on according to the first enable signal and the second enable signal.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
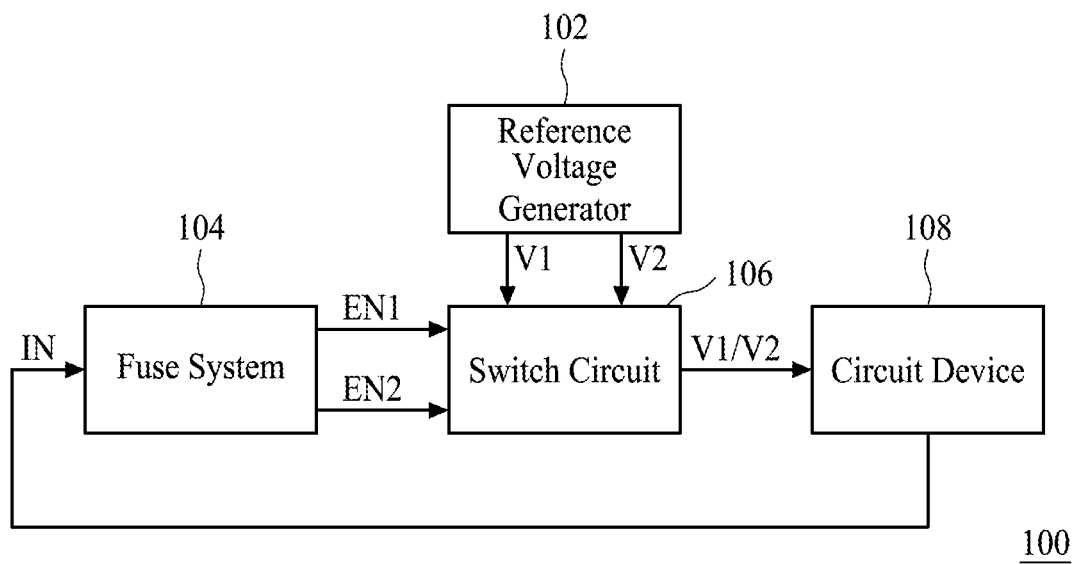
FIG. 1 is a block diagram of a voltage switching device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

In accordance with some embodiments of the disclosure, FIG. 1 is a block diagram of a voltage switching device 100. With reference to FIG. 1, in some embodiments, the voltage switching device 100 includes a reference voltage generator 102, a fuse system 104, and a switch circuit 106. The reference voltage generator 102 is configured to generate a first reference voltage V1 and a second reference voltage V2. The fuse system 104 is coupled to a circuit device 108, and the fuse system 104 is configured to generate a first enable signal EN1 and a second enable signal EN2 according to an input signal IN from the circuit device 108. The switch circuit 106 is coupled to the reference voltage generator 102, the fuse system 104, and the circuit device 108. The switch circuit 106 is configured to transmit the first reference voltage V1 or the second reference voltage V2 to the circuit device 108 according to the first enable signal EN1 and the second enable signal EN2 from the fuse system 104.

In some embodiments, the circuit device 108 may be a dynamic random access memory (DRAM) circuit under a test mode, for example. When the circuit device 108 is a DRAM circuit under test mode, the voltage switching device 100 is able to supply either of the first reference voltage V1 (e.g., 1.5 V) or the second reference voltage V2 (e.g., 1.2 V), and also have a return option to supply the other one of the reference voltages V1 or V2 due to the multi-use and reversible nature of the fuse system 104 (described later in the present disclosure). Accordingly, a manufacturing yield of the DRAM circuit may be improved by the multi-voltage switching ability of the voltage switching device 100. It should be noted that, the circuit device 108 is not limited to being a DRAM circuit, and in other embodiments of the present disclosure, the circuit device 108 may be any test apparatus or circuit which may require multiple reference voltages.

Figure 2:
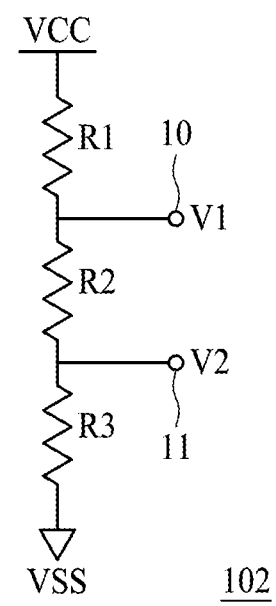
FIG. 2 is a schematic diagram of a reference voltage generator in accordance with some embodiments of the present disclosure.

FIG. 2 is a schematic diagram of the reference voltage generator 102 in accordance with some embodiments of the present disclosure. With reference to FIG. 2, in some embodiments, the reference voltage generator 102 includes a plurality of resistors R1, R2, and R3 coupled in series between a power supply terminal VCC and a ground terminal VSS. The reference voltage generator 102 may be configured as a voltage divider circuit, for example. In some embodiments, the first reference voltage V1 is generated at a first output terminal 10 between the first resistor R1 and the second resistor R2, and the second reference voltage V2 is generated at a second output terminal 11 between the second resistor R2 and the third resistor R3. The first reference voltage V1 and the second reference voltage V2 are transmitted to the switch circuit 106, as shown in FIG. 2.

Figure 3:
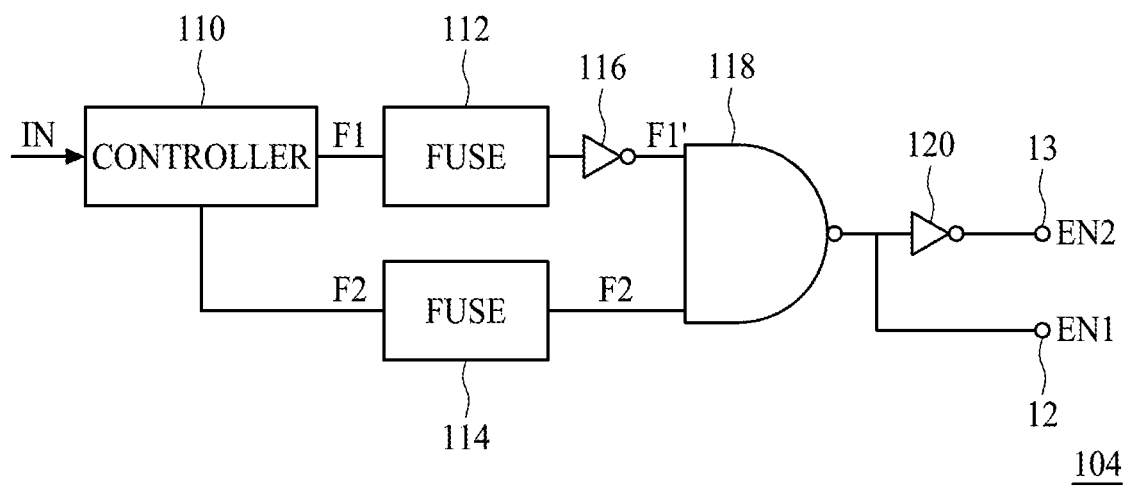
FIG. 3 is a schematic diagram of a fuse system in accordance with some embodiments of the present disclosure.

FIG. 3 is a schematic diagram of the fuse system 104 in accordance with some embodiments of the present disclosure. With reference to FIG. 3, in some embodiments, the fuse system 104 includes a controller 110, a first fuse element 112 coupled between a first inverter 116 and the controller 110, a NAND gate 118 coupled between the first inverter 116 and a second inverter 120, and a second fuse element 114 coupled between the controller 110 and the NAND gate 118. The controller 110 is configured to generate a first fuse signal F1 and a second fuse signal F2 according to the input signal IN received from the circuit device 108. The first fuse element 112 is configured according to the first fuse signal F1. When the first fuse element 112 is blown according to the first fuse signal F1, the first fuse signal F1 is at a logic high level such as a logic level 1. Referring to FIG. 3, the first fuse signal F1 is inverted by the first inverter 116 into a first input signal F1' of the NAND gate 118. The second fuse element 114 is configured according to the second fuse signal F2. When the second fuse element 114 is blown according to the second fuse signal F2, the second fuse signal F2 is at the logic high level such as the logic level 1. The second fuse signal F2 serves as a second input signal of the NAND gate 118.

In some embodiments, referring to FIG. 3, the NAND gate 118 is coupled between a third output terminal 12 and the second fuse element 114, and the second inverter 120 is coupled between a fourth output terminal 13 and the NAND gate 118. In some embodiments, the first enable signal EN1 is generated at the third output terminal 12, and the second enable signal EN2 is generated at the fourth output terminal 13.

Figure 4:
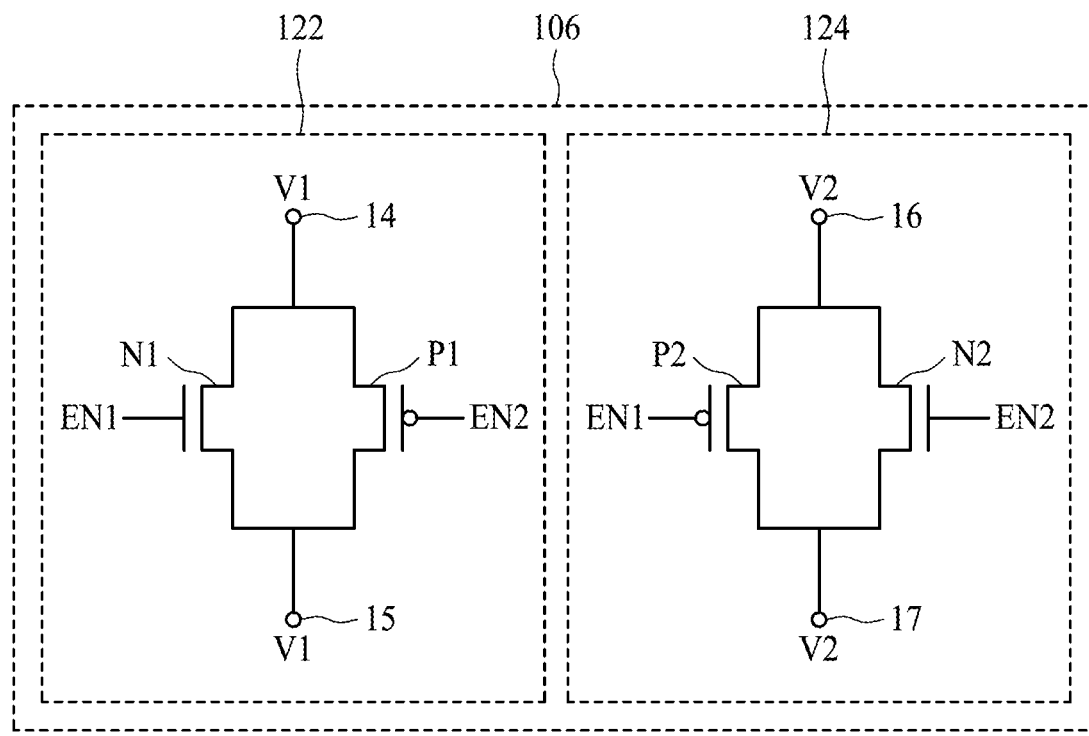
FIG. 4 is a schematic diagram of a switch circuit in accordance with some embodiments of the present disclosure.

FIG. 4 is a schematic diagram of the switch circuit 106 in accordance with some embodiments of the present disclosure. With reference to FIG. 4, in some embodiments, the switch circuit 106 includes a first circuit 122 and a second circuit 144. The first circuit 122 includes a first PMOS transistor P1 and a first NMOS transistor N1 coupled between a first input terminal 14 and a fifth output terminal 15. The second circuit 144 includes a second PMOS transistor P2 and a second NMOS transistor N2 coupled between a second input terminal 16 and a sixth output terminal 17. The first reference voltage V1 from the reference voltage generator 102 is transmitted to the first input terminal 14 of the first circuit 122, and the second reference voltage V2 from the reference voltage generator 102 is transmitted to the second input terminal 16 of the second circuit 124. In some embodiments, referring to FIG. 4, the first enable signal EN1 is applied to the gates of the first NMOS transistor N1 and the second PMOS transistor P2, and the second enable signal EN2 is applied to the gates of the first PMOS transistor P1 and the second NMOS transistor N2. In some embodiments, the first circuit 122 outputs the first reference voltage V1 when the first PMOS transistor P1 and the first NMOS transistor N1 are turned on according to the first enable signal EN1 and the second enable signal EN2. Moreover, the second circuit 124 outputs the second reference voltage V2 when the second PMOS transistor P2 and the second NMOS transistor N2 are turned on according to the first enable signal EN1 and the second enable signal EN2.

With reference to FIG. 3 and FIG. 4, the fuse system 104 and the switch circuit 106 of the voltage switching device 100 are discussed by way of examples hereafter. In a first example, the controller 110 generates logic level 0 for first fuse signal F1 and logic level 0 for the second fuse signal F2 according to the input signal IN, which indicates that the first reference voltage V1 is to be transmitted to the circuit device 108. Referring to FIG. 3, both of the first fuse element 112 and the second fuse element 114 are not blown in this case (logic level 0), and the first enable signal EN1 is logic level 1 at the third output terminal 12, while the second enable signal EN2 is logic level 0 at the fourth output terminal 13. Referring to FIG. 4, the first PMOS transistor P1 is turned on by the low voltage level of the second enable signal EN2 (logic level 0), and the first NMOS transistor N1 is turned on by the high voltage level of the first enable signal EN1 (logic level 1). The second PMOS transistor P2 and the second NMOS transistor N1 are turned off. Accordingly, the first circuit 122 of the switch circuit 106 transmits the first reference voltage V1 to the circuit device 108.

With reference to FIG. 3 and FIG. 4, in a second example, the controller 110 generates logic level 0 for first fuse signal F1 and logic level 1 for the second fuse signal F2 according to the input signal IN, which indicates that the second reference voltage V2 is to be transmitted to the circuit device 108. Referring to FIG. 3, the first fuse element 112 is not blown (logic level 0) while the second fuse element 114 is blown (logic level 1) in this case, and the first enable signal EN1 is logic level 0 at the third output terminal 12, while the second enable signal EN2 is logic level 1 at the fourth output terminal 13. Referring to FIG. 4, the second PMOS transistor P2 is turned on by the low voltage level of the first enable signal EN1 (logic level 0), and the second NMOS transistor N2 is turned on by the high voltage level of the second enable signal EN2 (logic level 1). The first PMOS transistor P1 and the first NMOS transistor N1 are turned off. Accordingly, the second circuit 124 of the switch circuit 106 transmits the second reference voltage V2 to the circuit device 108.

With reference to FIG. 3 and FIG. 4, in a third example, the controller 110 generates logic level 1 for first fuse signal F1 and logic level 0 or logic level 1 for the second fuse signal F2 according to the input signal IN, which indicates that the circuit device 108 requires a return transmission to the first reference voltage V1 after the second reference voltage V2 was passed. Referring to FIG. 3, the first fuse element 112 is blown (logic level 1) while the second fuse element 114 may or may not be blown (logic level 0 or logic level 1) in this case, and the first enable signal EN1 is logic level 1 at the third output terminal 12, while the second enable signal EN2 is logic level 0 at the fourth output terminal 13, due to the logic outputs of the NAND gate 118 and the second inverter 120. Referring to FIG. 4, the first PMOS transistor P1 is turned on by the low voltage level of the second enable signal EN2 (logic level 0), and the first NMOS transistor N1 is turned on by the high voltage level of the first enable signal EN1 (logic level 1). The second PMOS transistor P2 and the second NMOS transistor N1 are turned off. Accordingly, the first circuit 122 of the switch circuit 106 returns to transmitting the first reference voltage V1 to the circuit device 108.

Figure 5:
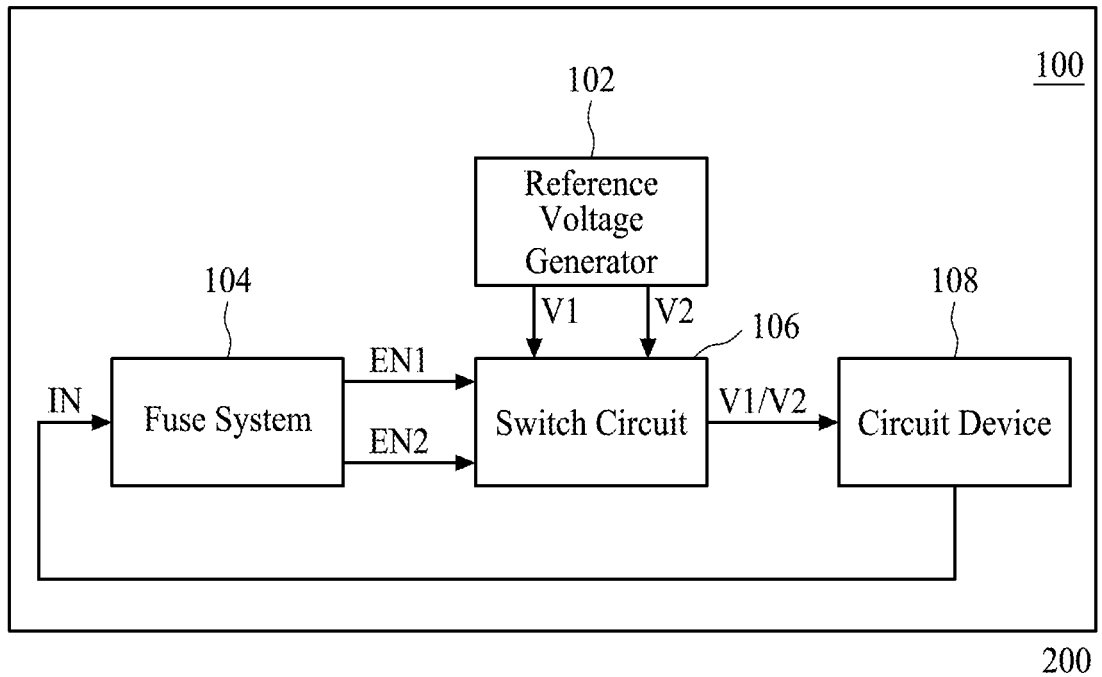
FIG. 5 is a block diagram of an integrated circuit device in accordance with some embodiments of the present disclosure.
Figure 6:
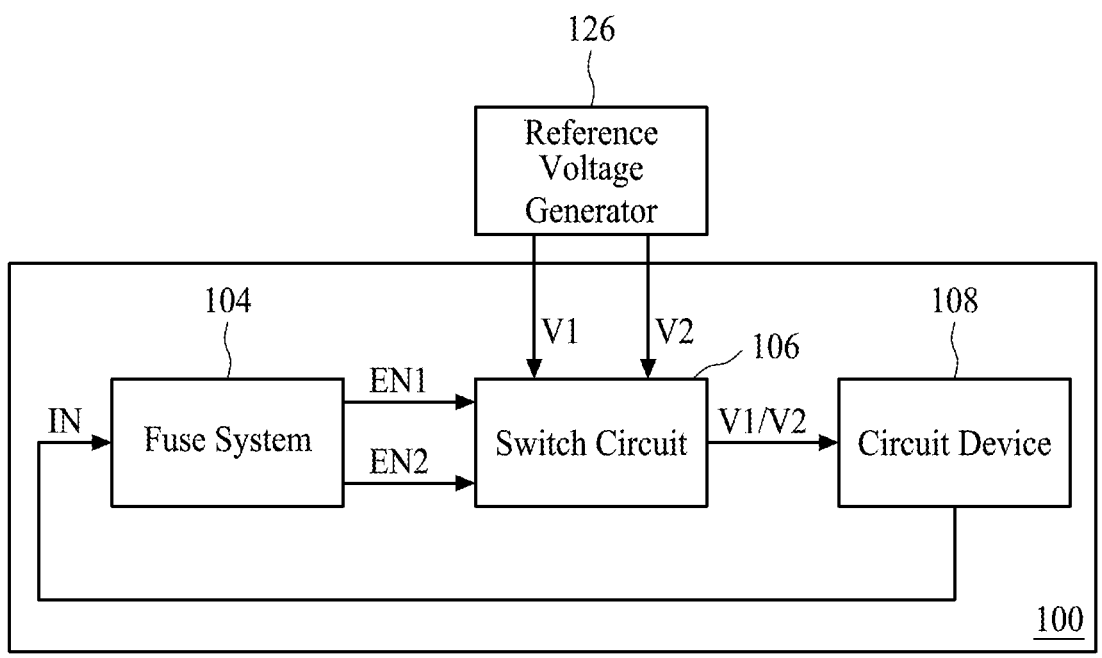
FIG. 6 is a block diagram of an integrated circuit device in accordance with some embodiments of the present disclosure.

It should be noted that, in some embodiments, the voltage switching device 100 may be included in an integrated circuit device, for example. FIG. 5 is a block diagram of an integrated circuit device 200, and FIG. 6 is a block diagram of an integrated circuit device 300 in accordance with some embodiments of the present disclosure. With reference to FIG. 5, the integrated circuit device 200 includes substantially the same components and operational principles of the voltage switching device 100, and therefore similar description thereof will be omitted for clarity. By integrating the voltage switching device 100 with the integrated circuit device 200, the circuit device 108 (e.g., a DRAM circuit) in the integrated circuit device 200 may obtain optimal performance at low costs.

On the other hand, referring to FIG. 6, according to some embodiments of the present disclosure, the integrated circuit device 300 may include an external reference voltage generator 126. Compared to the integrated device 200 of FIG. 5, the external reference voltage generator 126 is disposed externally from the integrated device 300. The integrated device 300 includes a voltage switching device 100'. The voltage switching device 100' includes the fuse system 104 coupled to the circuit device 108, and the switch circuit 106 coupled to the fuse system 104 and the circuit device 108. The switch circuit 106 transmits the first reference voltage V1 or the second reference voltage V2 to the circuit device 108 according to the first enable signal EN1 and the second enable signal EN2 from the fuse system.

Figure 7:
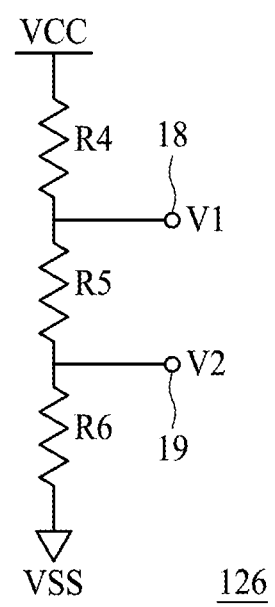
FIG. 7 is a circuit diagram of an external reference voltage generator in accordance with some embodiments of the present disclosure.

FIG. 7 is a circuit diagram of the external reference voltage generator 126 in accordance with some embodiments of the present disclosure. With reference to FIG. 6 and FIG. 7, in some embodiments, the external reference voltage generator 126 generates the first reference voltage V1 and the second reference voltage V2 externally from the integrated device 300. The external reference voltage generator 126 includes a plurality of resistors R4, R5, and R6 coupled in series between the power supply terminal VCC and the ground terminal VSS. The first reference voltage V1 is generated at a seventh output terminal 18 between the fourth resistor R4 and the fifth resistor R5, and the second reference voltage V2 is generated at an eighth output terminal 19 between the fifth resistor R5 and the sixth resistor R6. By placing the reference voltage generator 126 externally from the integrated circuit device 300, the integrated circuit device 300 may achieve lower power consumption and preferable heat dissipation characteristics.

Figure 8:
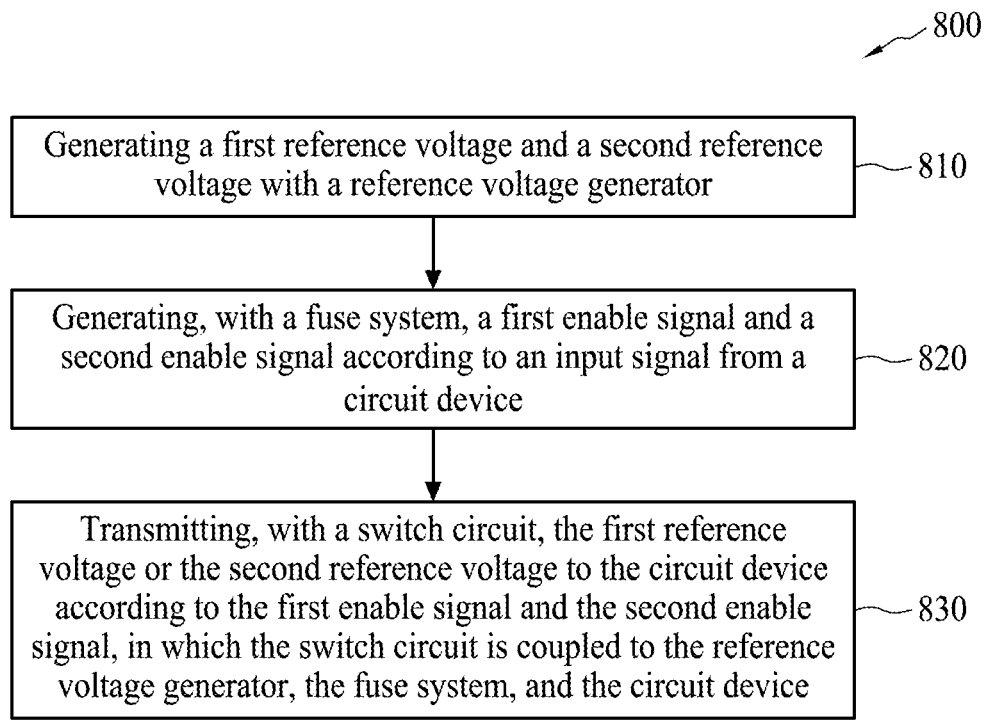
FIG. 8 is a flow diagram of a voltage switching method in accordance with some embodiments of the present disclosure

FIG. 8 is a flow diagram of a voltage switching method 800 in accordance with some embodiments of the present disclosure. The voltage switching method 800 will be described hereafter with additional references to the voltage switching device 100 depicted in FIG. 1 to FIG. 4. Referring to FIG. 8, the voltage switching method 800 includes generating a first reference voltage V1 and a second reference voltage V2 with a reference voltage generator 102 (Step 810); generating, with a fuse system 104, a first enable signal EN1 and a second enable signal EN2 according to an input signal IN from a circuit device 108 (Step 820); and transmitting, with a switch circuit 106, the first reference voltage V1 or the second reference voltage V2 to the circuit device 108 according to the first enable signal EN1 and the second enable signal EN2, in which the switch circuit 106 is coupled to the reference voltage generator 102, the fuse system 104, and the circuit device 108 (Step 830).

Referring to FIG. 3 in some embodiments, the voltage switching method 800 further includes generating, with a controller 110 of the fuse system 104, a first fuse signal F1 and a second fuse signal F2 according to the input signal IN; configuring a first fuse element 112 of the fuse system 104 according to the first fuse signal F1, in which the first fuse element 112 is coupled between a first inverter 116 and the controller 110, and when the first fuse element 112 is blown according to the first fuse signal F1, the first fuse signal F1 is at a logic high level; and configuring a second fuse element 114 of the fuse system 104 according to the second fuse signal F2, in which the second fuse element 114 is coupled between the controller 110 and a NAND gate 118, and when the second fuse element 114 is blown according to the second fuse signal F2, the second fuse signal is at the logic high level.

Referring to FIG. 4, in some embodiments, the voltage switching method 800 further includes providing a first PMOS transistor P1 and a first NMOS transistor N1 in a first circuit 122 of the switch circuit 106; and providing a second PMOS transistor P2 and a second NMOS transistor N2 in a second circuit 124 of the switch circuit 106. In some embodiments, the voltage switching method 800 further includes applying the first enable signal EN1 to the gates of the first NMOS transistor N1 and the second PMOS transistor P2; applying the second enable signal EN2 to the gates of the first PMOS transistor P1 and the second NMOS transistor N2; outputting the first reference voltage V1 with the first circuit 122 when the first PMOS transistor P1 and the first NMOS transistor N1 are turned on according to the first enable signal EN1 and the second enable signal EN2; and outputting the second reference voltage V2 with the second circuit 124 when the second PMOS transistor P2 and the second NMOS transistor N2 are turned on according to the first enable signal EN1 and the second enable signal EN2.

One aspect of the present disclosure provides a voltage switching device, including a reference voltage generator generating a first reference voltage and a second reference voltage, a fuse system coupled to a circuit device, and a switch circuit coupled to the reference voltage generator, the fuse system, and the circuit device. The fuse system generates a first enable signal and a second enable signal according to an input signal from a circuit device. The switch circuit transmits the first reference voltage or the second reference voltage to the circuit device according to the first enable signal and the second enable signal from the fuse system.

Another aspect of the present disclosure provides an integrated circuit device including a voltage switching device. The voltage switching device includes a fuse system coupled to a circuit device, and a switch circuit coupled to the fuse system and the circuit device. The fuse system generates a first enable signal and a second enable signal according to an input signal from a circuit device. The switch circuit transmits the first reference voltage or the second reference voltage to the circuit device according to the first enable signal and the second enable signal from the fuse system.

Another aspect of the present disclosure provides a voltage switching method, including generating a first reference voltage and a second reference voltage with a reference voltage generator; generating, with a fuse system, a first enable signal and a second enable signal according to an input signal from a circuit device; and transmitting, with a switch circuit, the first reference voltage or the second reference voltage to the circuit device according to the first enable signal and the second enable signal, in which the switch circuit is coupled to the reference voltage generator, the fuse system, and the circuit device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A voltage switching device, comprising:
   a reference voltage generator generating a first reference voltage and a second reference voltage;
   a fuse system coupled to a circuit device, the fuse system generating a first enable signal and a second enable signal according to an input signal from the circuit device; and
   a switch circuit coupled to the reference voltage generator, the fuse system, and the circuit device, the switch circuit transmitting the first reference voltage or the second reference voltage to the circuit device according to the first enable signal and the second enable signal from the fuse system;
   wherein the reference voltage generator comprises a plurality of resistors coupled in series between a power supply terminal and a ground terminal, the first reference voltage is generated at a first output terminal between a first resistor and a second resistor, and the second reference voltage is generated at a second output terminal between the second resistor and a third resistor.

2. The voltage switching device of claim 1, wherein the fuse system comprises:
   a controller generating a first fuse signal and a second fuse signal according to the input signal;
   a first fuse element coupled between a first inverter and the controller, the first fuse element being configured according to the first fuse signal, wherein when the first fuse element is blown according to the first fuse signal, the first fuse signal is at a logic high level;
   a NAND gate coupled between the first inverter and a second inverter; and
   a second fuse element coupled between the controller and the NAND gate, the second fuse element being configured according to the second fuse signal, wherein when the second fuse element is blown according to the second fuse signal, the second fuse signal is at the logic high level.

3. The voltage switching device of claim 2, wherein the NAND gate is coupled between a third output terminal and the second fuse element, and the second inverter is coupled between a fourth output terminal and the NAND gate.

4. The voltage switching device of claim 3, wherein the first enable signal is generated at the third output terminal, and the second enable signal is generated at the fourth output terminal.

5. The voltage switching device of claim 1, wherein the switch circuit comprises:
   a first circuit comprising a first PMOS transistor and a first NMOS transistor; and
   a second circuit comprising a second PMOS transistor and a second NMOS transistor.

6. The voltage switching device of claim 5, wherein the first enable signal is applied to the gates of the first NMOS transistor and the second PMOS transistor, the second enable signal is applied to the gates of the first PMOS transistor and the second NMOS transistor, the first circuit outputting the first reference voltage when the first PMOS transistor and the first NMOS transistor are turned on according to the first enable signal and the second enable signal, and the second circuit outputting the second reference voltage when the second PMOS transistor and the second NMOS transistor are turned on according to the first enable signal and the second enable signal.

7. An integrated circuit device, comprising:
a voltage switching device, comprising:
a fuse system coupled to a circuit device, the fuse system generating a first enable signal and a second enable signal according to an input signal from the circuit device; and
a switch circuit coupled to the fuse system and the circuit device, the switch circuit transmitting a first reference voltage or a second reference voltage to the circuit device according to the first enable signal and the second enable signal from the fuse system;
wherein the voltage switching device further comprises a reference voltage generator generating the first reference voltage and the second reference voltage;
wherein the reference voltage generator comprises a plurality of resistors coupled in series between a power supply terminal and a ground terminal, the first reference voltage is generated at a first output terminal between a first resistor and a second resistor, and the second reference voltage is generated at a second output terminal between the second resistor and a third resistor.

8. The integrated circuit device of claim 7, wherein the fuse system comprises:
a controller generating a first fuse signal and a second fuse signal according to the input signal;
a first fuse element coupled between a first inverter and the controller, the first fuse element being configured according to the first fuse signal, wherein when the first fuse element is blown according to the first fuse signal, the first fuse signal is at a logic high level;
a NAND gate coupled between the first inverter and a second inverter; and
a second fuse element coupled between the controller and the NAND gate, the second fuse element being configured according to the second fuse signal, wherein when the second fuse element is blown according to the second fuse signal, the second fuse signal is at the logic high level.

9. The integrated circuit device of claim 8, wherein the NAND gate is coupled between a third output terminal and the second fuse element, and the second inverter is coupled between a fourth output terminal and the NAND gate.

10. The integrated circuit device of claim 9, wherein the first enable signal is generated at the third output terminal, and the second enable signal is generated at the fourth output terminal.

11. The integrated circuit device of claim 7, wherein the switch circuit comprises:
a first circuit comprising a first PMOS transistor and a first NMOS transistor; and
a second circuit comprising a second PMOS transistor and second NMOS transistor.

12. The integrated circuit device of claim 11, wherein the first enable signal is applied to the gates of the first NMOS transistor and the second PMOS transistor, the second enable signal is applied to the gates of the first PMOS transistor and the second NMOS transistor, the first circuit outputting the first reference voltage when the first PMOS transistor and the first NMOS transistor are turned on according to the first enable signal and the second enable signal, and the second circuit outputting the second reference voltage when the second PMOS transistor and the second NMOS transistor are turned on according to the first enable signal and the second enable signal.

13. The integrated circuit device of claim 7, wherein an external reference voltage generator generates the first reference voltage and the second reference voltage, wherein the external reference voltage generator comprises a plurality of resistors coupled in series between a power supply terminal and a ground terminal, and the first reference voltage is generated at a first output terminal between a first resistor and a second resistor, and the second reference voltage is generated at a second output terminal between the second resistor and a third resistor.

14. A voltage switching method, comprising:
generating a first reference voltage and a second reference voltage with a reference voltage generator;
generating, with a fuse system, a first enable signal and a second enable signal according to an input signal from a circuit device;
transmitting, with a switch circuit, the first reference voltage or the second reference voltage to the circuit device according to the first enable signal and the second enable signal, wherein the switch circuit is coupled to the reference voltage generator, the fuse system, and the circuit device;
generating, with a controller of the fuse system, a first fuse signal and a second fuse signal according to the input signal;
configuring a first fuse element of the fuse system according to the first fuse signal, wherein the first fuse element is coupled between a first inverter and the controller, and when the first fuse element is blown according to the first fuse signal, the first fuse signal is at a logic high level; and
configuring a second fuse element of the fuse system according to the second fuse signal, wherein the second fuse element is coupled between the controller and a NAND gate, and when the second fuse element is blown according to the second fuse signal, the second fuse signal is at the logic high level.

15. The voltage switching method of claim 14, further comprising:
providing a first PMOS transistor and a first NMOS transistor in a first circuit of the switch circuit; and
providing a second PMOS transistor and a second NMOS transistor in a second circuit of the switch circuit.

16. The voltage switching method of claim 15, further comprising:
applying the first enable signal to the gates of the first NMOS transistor and the second PMOS transistor;
applying the second enable signal to the gates of the first PMOS transistor and the second NMOS transistor;
outputting the first reference voltage with the first circuit when the first PMOS transistor and the first NMOS transistor are turned on according to the first enable signal and the second enable signal; and
outputting the second reference voltage with the second circuit when the second PMOS transistor and the second NMOS transistor are turned on according to the first enable signal and the second enable signal.

* * * * *